US006965233B2

(12) United States Patent
Le Roux

(10) Patent No.: US 6,965,233 B2
(45) Date of Patent: Nov. 15, 2005

(54) METHOD AND APPARATUS FOR FAST IMAGING BY NUCLEAR MAGNETIC RESONANCE

(75) Inventor: Patrick Le Roux, Palaiseau (FR)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 176 days.

(21) Appl. No.: 10/396,233

(22) Filed: Mar. 25, 2003

(65) Prior Publication Data

US 2003/0189425 A1 Oct. 9, 2003

(30) Foreign Application Priority Data

Apr. 5, 2002 (FR) ............................................. 02 04294

(51) Int. Cl.[7] ................................................ G01V 3/00
(52) U.S. Cl. ...................................... 324/309; 324/307
(58) Field of Search .............................. 324/309, 307, 324/300, 318, 306, 312

(56) References Cited

U.S. PATENT DOCUMENTS

| 4,697,148 | A |   | 9/1987 | Strobel et al. ............... 324/309 |
|---|---|---|---|---|
| 5,623,207 | A | * | 4/1997 | Weissenberger et al. ..... 324/309 |
| 6,008,647 | A | * | 12/1999 | Zhou et al. .................. 324/309 |
| 6,011,392 | A | * | 1/2000 | Zhou et al. .................. 324/309 |
| 6,137,289 | A | * | 10/2000 | Goto ........................... 324/306 |
| 6,265,873 | B1 |   | 7/2001 | Le Roux .................... 324/309 |
| 2003/0189425 | A1 | * | 10/2003 | Le Roux .................... 324/309 |

FOREIGN PATENT DOCUMENTS

EP          0158965      10/1985

OTHER PUBLICATIONS

P. Leroux, "Spin Echoes Nithaquapratic Phase Modulation . . . ", Proc, Intl. Soc. Mas. Reson. Med 9 (2001) p. 1788.
P.Leroux, "Progress in Non–CPMG Fast Spinecho", Proc. Intl Soc. Mag. Reson. Med. 7 (1999) p 1–2.
V. N. Ikonomidou et al, "Improved Shinnar–Le Roax Algorithm", J. Mag. Reson. 143, p 30–34 (2000).
P. Leroux, "Non–OPMG Fast Spin Echo yn Practice", Proc Intl. Soc Mag. Reson. Med 8 (2000) p 1–2.
Wan, X et al, "Reduction of Phase Error Ghosting Artifacts", Magnetic Resonance in Medicing, vol. 34, No. 4, 1995, pp 632–638.
Norris et al, "On The Application of Ultra•Fast Rare Experiments", Magnetic Resonance in Medicine, vol. 27, No. 1, 1992, pp 142–164.
Alsop, "The Sensitivity of Low Flip Angle Rare Imaging", Magnetic Resonance in Medicine, vol. 37, pp. 176–184.

* cited by examiner

*Primary Examiner*—Brij Shrivastav
*Assistant Examiner*—Tiffany A. Fetzner
(74) *Attorney, Agent, or Firm*—Jay L. Chaskin, Esq.; Cantor Colburn LLP

(57) ABSTRACT

In the acquisition of NMR signals in FSE or fast spin echo type sequences the emission phase of the 180° refocusing pulse evolves quadratically. In order to prevent problems of oscillation of the output signal, the sequence is subjected to a preparation pulses. A history is provided for the common difference of the quadratic sequence of the phase variation with respect to the first seven refocusing pulses. This history leads to an immediate thermal equilibrium.

29 Claims, 5 Drawing Sheets

METHOD AND APPARATUS FOR FAST IMAGING BY NUCLEAR MAGNETIC RESONANCE

CROSS-REFERENCE TO RELATED APPLICATIONS

This application claims a benefit of a priority under 35 USC 119 to French patent application No. 02 04294 filed Apr. 5, 2002, the entire contents of which are hereby incorporated by reference.

BACKGROUND OF THE INVENTION

The present invention is directed to a method and apparatus for fast imaging of a part of a body subjected to an intense magnetic field known as an orientation field during a nuclear magnetic resonance (NMR). This type of imaging is currently meeting with increasing success in the medical field where the images produced serve as a diagnostic aid, especially in the diagnosis of cancer. The application of the disclosed embodiments of the invention however is not limited to this field. The embodiments can also be implemented, for example, in physical measurements using spectrometers.

In nuclear magnetic resonance imaging, an image of a slice of a body to be examined is obtained by subjecting the body in question and, especially, the part in which the slice is located, to a continuous, intense and homogenous magnetic field B0. Under the effect of this field B0, after a few instants, (within a few seconds), the magnetic moments of the particles of the body align their orientation with the direction of the magnetic field: this is why this field is known as an orientation field. If the magnetic moments of the particles of the body are then excited by an RF excitation oscillating at an appropriate frequency, it causes the orientation of the excited magnetic moments to get tipped or flipped.

At the end of the excitation, these magnetic moments tend to get realigned with the orientation field in a motion of natural precession known as free precession. During this precession motion, the particles radiate an electromagnetic de-excitation energy that can be measured. The frequency of the de-excitation signal, also called the NMR signal, is characteristic of the excited particles (in medicine, these particles are the hydrogen atoms contained in the water molecules disseminated throughout the human body) and of the force of the orientation field. The characteristics of the body are deduced from the processing of the measured signal.

The processing of the measured signal in order to extract an image gets complicated because all the particles of the body throughout the excited region re-emit a de-excitation signal at the end of the excitation. It is therefore important to distinguish the contributions, in the total NMR signal, of all the elementary regions (known as voxels) of the volume excited to reconstruct their distribution, ultimately to prepare the image. This distinguishing can be done only by performing a series of excitation-measurement sequences during each of which the NMR signals to be measured are encoded differently from one sequence to another. Since the encoding applied is known, the image can be reconstructed by pure imaging techniques, especially of the 2DFT type.

The measurement of the NMR signal actually relates to the amplitude of this signal. Indeed, given the modulation frequency around which the NMR signal is examined, all that can be hoped for as a measurement result is a measurement of the density, in the structures examined, of the specific particles (hydrogen) for which only one of the resonance frequencies is examined. Broadly speaking, at the end of a given period of time after the excitation, the greater this density, the stronger is the NMR signal. Indeed, this density does not act solely on the original amplitude of the NMR signal. In practice, in medicine, it is even assumed that all the regions of the body, from this viewpoint, make the same contribution to the NMR signal. However, the density acts fairly strongly on the damping, namely the relaxation, of this NMR signal. This damping is a complex damping: it represents an interaction known as the spin-lattice interaction of the excited particles (the proton of the hydrogen atom) with the surrounding matter and an interaction known as the spin-spin interaction of the protons with one another.

In a known model of the physical phenomena that come into play, it has been determined that the spin-lattice relaxation time, known as the time T1, corresponds to the time constant of an exponential regrowth (a reorientation) of the component, aligned with the orientation field (also called the longitudinal component) of the total magnetic moment at a concerned position of the body. The spin-spin relaxation time, known as T2, also corresponds to a time constant but in this case to an exponential decrease of the transverse component (orthogonal to the longitudinal component) of these magnetic moments. In an example that shall be referred to further below in the context of the description of an embodiment of the invention, reference shall be made to a time T1 of about 500 ms and above all a time T2 of about 100 ms: the concerned regions of the body will be mainly the head and more specifically the brain.

It is possible, in different types of series of imaging, to obtain the appearance of one relaxation phenomenon in preference to another. It is said then that images are made in T1 or T2 as the case may be. The essential parameter of NMR images brought into play in this case is then the repetition time TR that marks the periodicity of the sequences of the series of imaging sequences implemented.

It is known that it is possible to make use of the T2 image, with its characteristics of differentiation. In particular, it is known that, in the human brain, gray matter, white matter and to an even greater extent tumors, possess well-differentiated responses in T2. In practice, the NMR signal measured is never anything but a signal corresponding to the component orthogonal to the orientation field of the motion of precession of the flipped magnetic moments. Now it is known that, if the repetition time is in the range of a mean value of T1, the amplitude of this signal directly represents the contributions in T1 of the different parts of the body.

To make an image in T1, it is necessary to wait for a total regrowth of the magnetization (of its longitudinal component): the duration of the wait necessary between each sequence is about three or four times the duration of T1. At the end of this duration, leaving aside the concentration of the particles (which are not considered), it can be said that the first NMR signal measured is dependent only on the relaxation time T2. It is only if the repetition rate is too fast that the effect of the decrease of the NMR signal in T2 disappears in the face of the importance of the differentiation of the regrowths in T1.

At this stage in the explanation, there immediately appears one of the difficulties pertaining to the images in T2: they are long. In practice, they are about two or three times longer than the T1 images. For example, for a T2 image of a section of the head, a patient must undergo examination without moving for 17 minutes. To prevent the patient from moving, it becomes necessary to fix his head in a collar, which makes the NMR examination very distressing even if it is not harmful.

A known way of overcoming the drawbacks referred to consists in proposing a fast T2 image. In one example, the image may last about two to three minutes. At the same time, the disturbing effects of the contrast seen in T1 are avoided in this image. The goal in view is that the period of acquisition should not be too lengthy both for the patient and in terms of the economical use of the machine.

Recently, fast image acquisition methods known as fast spin echo or FSE type methods have been proposed. In practice, there are sequences known as pure FSE sequences, with typically 16 echoes and 16 acquisitions, repeated every four seconds. This gives 64 seconds of acquisition for one section. Other methods, known as single shot FSE or SSFSE methods, are described below. These SSFSE methods use sequences comprising an excitation of the magnetic moments of the protons, known as a flip, prompting a major flip of the magnetization, which is typically a 90° flip (whereas in the SSFP type methods the original flip was a small-angled flip) followed by a large number of spin echo excitation pulses (at 180°), known as refocusing pulses, very close to each another, typically separated from each other by a few milliseconds. Furthermore, phase-encoding gradients are applied between each of these refocusing pulses, and before the reading. These phase-encoding gradients vary in successive steps from one echo to another. The gradient pulses thus applied are furthermore compensated for in a subsequent gradient pulse before the next refocusing pulses. As regards the section select gradient pulses, the fact of centering them in time on the central date of the refocusing pulses gives rise to automatic compensation for these pulses. It can be shown that this is also the case for the read gradient pulses.

Typically, it is thus possible, during a single sequence of decrease of the signal in T2 (equal for example to about 400 ms), to acquire 128 echoes, each representing what happens in one line of the image. By thus applying read gradients during the reading, it is possible, after a single sequence, to acquire a full image in a very short period of time, equal to about T2 or a multiple of several times T2. Typically, each refocusing pulses may last 5 ms (to be properly selective), or 2.4 ms in being less selective. The measurement duration of the NMR signal, at the time of each echo, in taking 256 samples every 8 microseconds, last about two ms.

One presentation of this technique is given in U.S. Pat. No. 6,265,873, the contents of which are entirely incorporated herein by reference. The present invention is an improvement of the method described in this patent.

FIGS. 1a to 1g show the geometrical, theoretical and practical consequences of the refocusing excitations of the FSE type fast refocusing methods. They also show how the problems of signal quality were resolved in the above-mentioned patent. The problem resolved by the present invention is then explained. Specifically, the method disclosed in the patent referred to above, and in the present invention, comprises an additional encoding to be applied to the refocusing pulses in order to improve the quality of the NMR signal detected. Rather than encoding the amplitude of these refocusing signals, which results in complex problems of shape definition, it is the phase of these refocusing pulses that has been encoded. The phase is determined with respect to a synchronized date of evolution of the NMR phenomenon. In this way, a 3 dB improvement is produced in the level of the signal detected. It will be shown that this improvement makes it possible either to acquire the images even faster or, above all, to take account thereafter, in the images, the phenomena of movement by the patient, the phenomena of molecular diffusion and the phenomena of chemical shifts. These phenomena ultimately make it possible to measure the temperature of the patient's body through a measurement of the NMR signal itself. This was hitherto not possible with the FSE sequence.

FIGS. 1a to 1g are shown in the referential system rotating at f0, f0 being the free precession frequency, known as the Larmor frequency, of the magnetizations of the protons subjected to a magnetic orientation field Bo. This rotating referential system comprises an axis z oriented as the field Bo and axes x and y forming a plane xy in which, from one refocusing excitation to another, the orientations (or rather the measured components) of the excited magnetic moments are supposed to occur. At the outset (FIG. 1a), the magnetization of each proton is equal to Mo and is oriented along the direction z. During a first 90° excitation, corresponding to a flip around the axis y (FIG. 1b), the magnetization Mi is collinear with the axis x. The rotating reference system xyz is herein shown arbitrarily as rotating in the normal direction.

FIG. 1c shows the phase shifts of the components. These phase shifts are due to the inhomogeneities of the field Bo. These phase shifts are furthermore reinforced by the presence, in free precession, of superimposed field gradients. Thus a schematic view is given of components x1 and x2 in the plane xy. The components x1 correspond to protons precessing at a respectively lower frequency. These are slower protons. The components x2 correspond to the faster protons. The in-phase component of the orientation values of these protons continues to remain aligned with the axis x.

FIG. 1d shows the effects of a refocusing pulse about the axis x. These pulses about the axis x, which are perpendicular to the initial excitation which was about the axis y, correspond to excitations called CPMG (Carr-Purcell-Meiboom-Gill) type excitations. Typically, before the application of the 180° excitation, the components x1− and x2−, in accordance with their form shown in FIG. 1c, are turned over by an angle φ=180° into components x1+ and x2+ whose main characteristic is that they are now located in a position symmetrical with their initial position in relation to the magnetization in a phase oriented along the axis x. In a known way, at the end of a period of time, after the 180° pulse, equal to the time between the application of the 90° pulse and the application of the 180° pulse, the NMR signal presents all its components in phase along the axis x. It is again measurable.

However, the 180° refocusing pulse is not applied with perfect efficiency to all the protons examined. It appears that certain protons are subjected to a smaller-angle refocusing around the axis x. The protons concerned are those located on the front face and the rear face of the section. Indeed, the cases of 180° refocusing cannot be perfect in the section and zero outside the section. Otherwise, the duration of the 180° pulse would have to be very great (in theory infinite). In the transition zones, the refocusing is therefore imperfect. FIG. 1e shows a refocusing where φ is about 135°. In this case, rather than being located in the plane xy, as in FIG. 1d, the component x2− has been converted into a component x2+ possessing a significant component along the axis z. This significant component reduces the measurable component x'2+, shown in the plane xy. Nevertheless, this component x2+ gets phase-shifted after the application of the 135° pulse to which it has been subjected according to the drawing of FIG. 1e.

This phase shift leads firstly to a subsequent resynchronization during which the NMR signal is again measurable (with a contribution that is all the same deteriorated but negligibly so for the component x2), and continues to get phase-shifted so that, during a subsequent 180° refocusing excitation, in FIG. 1f, it is again at x2−.

In short, it can be noted in FIG. 1f that, just before this subsequent refocusing pulse, the component x2− is in the position that is symmetrical to that of the component x2+ of FIG. 1e (with a same component along z). If it is then subjected to a same refocusing operation, with a same φ=135° amplitude smaller than 180°, as it was during the previous refocusing pulse, the component x2− gets converted into a component x2+ that is now located in the plane xy.

In other words, every other time, even if the pulses at 180° are imperfect, it seems that, if the 180° pulse is applied to an axis (x) perpendicular to the axis (y) about which the initial excitation pulse has been applied, there is a phase-shifting of all the magnetizations of the protons. This is corroborated in FIG. 2a where the y-axis indicates the modulus of the measurable NMR signal while the x-axis indicates the refocusing excitation number in the sequence (here there are 32 of them) for which the NMR signal is measured after standardization. It can be seen that, on the different curves, corresponding to 30° variations (180°, 150°, 120°, 90°, ...) in the refocusing pulse, the amplitudes of the NMR signals remain constant, even if they are of lower value if the flipping is imperfect.

By comparison, the FIG. 1g shows what happens when the refocusing pulse is done about the axis y, namely the axis about which the magnetic moments have flipped, given the initial 90° excitation pulse. The 180° refocusing has not been shown because, naturally, for the protons subjected to these 180° refocusing pulses (whatever the axis) the phenomenon is perfect in theory. There is a natural synchronization. It will furthermore be observed that the fact of prompting a flipping of the magnetic moments about the axis y rather than about the axis x amounts in fact, in this case, to effecting a temporal shift, equivalent to a delay of a quarter period (a period equal to 1/f0), in the application of the refocusing pulse.

FIG. 1g shows that a magnetization component x2− in the plane xy (before the application of a major refocusing pulse) gets flipped into x2+ after the application of the refocusing pseudo-pulse φ having a value below 180°. Here, we have only shown the case of the fastest protons so as not to burden the drawing. As in the above case, it can be seen already that the component x2+, after application of the refocusing pulse, has a component oriented along the axis z that is negative. It must also be noted that the component along x is now negative (whereas it remained positive earlier). Consequently, just before the application of the subsequent 180° refocusing pulse (which itself is also imperfect, but under the same conditions), the component x2+ has become x2+−, which is symmetrical to the plane xz of the component x2+.

If this component x2+− too undergoes a φ flip (smaller than 180°) identical to the previous φ, the component x2+− becomes a component x2++. This component x2++ then has the particular feature of also having a component oriented along the axis z while, according to the excitations called CPMG excitations of the previous figures, the component along z would have been reduced to zero. In the schematic example shown, the component along z is different from the component along z after the previous refocusing pulse. It has even risen in such a way that soon there is no longer any measurable NMR signal at the time of the resynchronization. This occurs in fact after a small number of echoes, four or five in practice, in any case fewer than ten.

This is shown schematically in FIG. 2b, which is presented so as to correspond to FIG. 2a, and is based on the same assumptions as this FIG. 2a. FIG. 2b shows what happens when the condition known as the CPMG condition (corresponding to FIGS. 1a to 1f) is not fulfilled. It is noted that, for different 180° flips, firstly the measurable NMR signal decreases very sharply with the rank of the echo. It is no longer even measurable after the tenth echo. Secondly, the NMR signal undergoes an alternating development whose period is all the greater as the divergence from the 180° value is low.

Considerations of this type have led to consider pulses not meeting the CPMG conditions as being unsuited to the production of measurable NMR signals. At least, it could be asserted that if the magnetization were not oriented along the axis x, the orientation would be analyzed as a combination of a component along the axis x (called a real axis) and a component along the axis y (called an imaginary axis). Using the FSE method under CPMG conditions actually amounts to destroying the imaginary component. Thus 3 dB are lost. Furthermore, owing to movements by the patient, increasing numbers of components are thus gradually eliminated. Indeed, with the patient's movements, the phase of the magnetizations gets shifted and the off-phase component of these shifted magnetizations is dampened. It will furthermore be noted that this dampened component does not disappear from the signal but reverberates in the image in the form of black dots that scramble this image.

To resolve this first problem, it has been proposed to eliminate one of the components of the signal by means of gradient echo pulses so that they disappear from this signal. However, the elimination of this component, dividing the useful signal by two, results in a fourfold increase, for identical signal-to-noise ratios, of the acquisition time for an image, and this is not acceptable.

It will be noted that this duration, which is limited by the absorption of energy in the patient, must be considered in the case of the acquisition of multiple-section images (for which the duration of acquisition is proportional to the number of sections) and of images of directions of molecular diffusion. It is sought, indeed, to acquire images of components of molecular diffusion in one direction and then another and so on and so forth. It can be shown that images in three cardinal directions are not as interesting as images acquired in a hundred directions. These images make it possible especially to measure the presence of the fibers (in which the diffusion is restricted and has a preferred direction). In particular, at the position of neurons of the brain, the depiction of a mean component (in a single direction) is of no interest as compared with knowledge of the numerous ramifications of the neurons. What must be done is to determine the numbers and orientations of these ramifications through the directions measured. The numbers of the acquisitions thus soon become a problem if each acquisition lasts too long. For example, 100 directions and 10 sections entail a 20-minute examination, even if each image is acquired within one second.

With the conditions known as CPMG conditions (90° flip and 180° refocusing excitations on the mutually perpendicular axes y and x, and the activation of these excitations in phase), it was observed with FIG. 1g that a component of the NMR signal disappeared rapidly after a few echoes, in practice about ten echoes. To an even greater extent, this component of the signal is no longer measurable when 128 successive echo pulses are implemented in a practical sequence.

Conditions known as the Carr-Purcell or CP conditions have also been proposed. In these conditions, the flip and refocusing excitations are located on a same axis (for example the axis y). And the flip and first refocusing excitations are in phase. In this case, from one refocusing excitation to another, the direction of the refocusing excitation is changed (they are in phase or in phase opposition with this first refocusing excitation). The demodulation processing is adapted. It can easily be shown, especially with reference to FIG. 1g, that we are then in a situation comparable to that of FIG. 1f (the one showing the positive effects of the CPMG conditions): in any case, an imaginary or real component of the NMR signal is destroyed.

In the patent cited above, this problem is overcome by modifying the phase of the 180° refocusing pulse (and therefore that of the receiver at the time of the reception). This modification is done quadratically from one refocusing pulse to another. In other words, the phase $\Phi$ of each refocusing pulse is of the $\Phi = \Delta_{i2}$ type in which $\Delta$ is a sweep factor and in which i is the number of the 180° refocusing pulse or 180° pseudo-refocusing pulse.

This means that it all amounts to ensuring that the 180° refocusing pulses or the imperfect 180° refocusing pulses do not act identically on all the same magnetic moments to the point of destroying the imaginary component of some of them. In the above-mentioned patent, provides for a gradual sliding of the phase in a quadratic progression. This quadratic progression is equivalent to a linear sweep in frequency, which can be likened, for its part, to a shifting of the date of reading on the read axis (typically the above axis x). In other words, according to the patent cited above, from one refocusing excitation to another focusing excitation, the phase varies quadratically.

When the method with quadratic phase shift was implemented, it was realized nevertheless that the state of dynamic equilibrium was not immediately established. Consequently, there was a loss in signal level. Indeed, there was a residual oscillation of the measured signals, resulting in a loss of sensitivity. To prevent this oscillation, dynamic equilibrium thus prompted can be stabilized as soon as the first echoes occurred. This stabilization was obtained by subjecting the magnetizations to an initial preparation during a limited number of echoes. The preparatory echoes may furthermore be used for the reconstruction of the images. The number of preparation echoes was limited to seven. A better (but only marginally better) result can be obtained by choosing a greater number of preparation echoes.

To be able to determine the characteristics of these preparatory echo pulses, a procedure of successive images was then initiated. This entailed the exploration, with small increments, of the effects of the different phase shifts of the refocusing pulses on each other. According to a complex theory that has to be explained, it was foreseen that the phenomenon would accept a stationary characteristic, for which the eigen vectors (or eigen functions) were sought. With these eigen functions, a mode of preparation for this dynamic equilibrium was determined so that ultimate measured signal level was the greatest possible level. It was then found that, provided the phases of the first refocusing pulses were thus conditioned in a special way, a better result was obtained. The preparation depends on the chosen law of quadratic progression and on the amplitude of the initial echo excitation.

BRIEF DESCRIPTION OF THE INVENTION

The invention and embodiments thereof is a method and apparatus for signal acquisition in NMR comprising:

subjecting a body to be examined to a magnetic orientation field;

subjecting particles of the body thus magnetically oriented to an initial electromagnetic excitation;

subjecting the body to a succession of refocusing excitations;

modifying quadratically the phase $\Phi_{xi}$ of the refocusing excitations numbered i in this succession wherein it is of the $\Phi_{xi} - \Phi_{xi-1} = \delta_i + \delta_{i-1}$ type with a common difference $\Delta$ equal to $\delta_i - \delta_{i-1}$; and applying at the start of this quadratic evolution, a sequence of preparation excitations during which the common difference $\Delta$ evolves according to a chronological sequence planned in advance.

BRIEF DESCRIPTION OF THE DRAWINGS

The present invention and embodiments thereof will be understood more clearly from the following description and from the appended figures. These figures are given purely by way of an indication and in no way restrict the scope of the invention. Of these figures.

DETAILED DESCRIPTION OF THE INVENTION

Figure 1A:
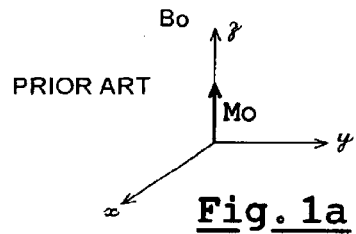
FIGS. 1a to 2b are views, already described, of the physical phenomenon to be mastered.
Figure 1B:
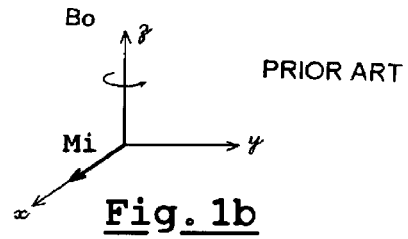
Figure 1C:
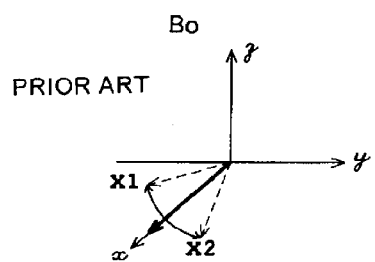
Figure 1D:
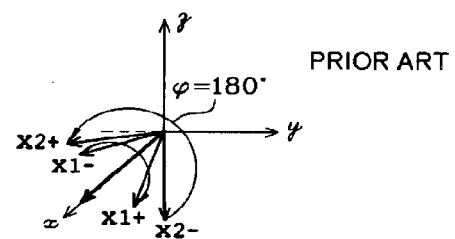
Figure 1E:
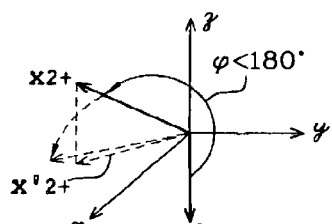
Figure 1F:
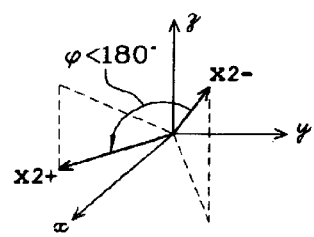
Figure 1G:
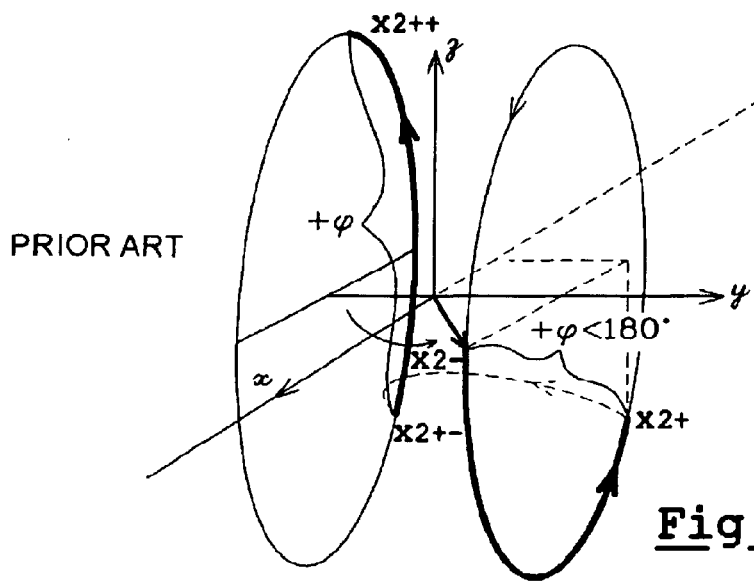
Figure 2A:
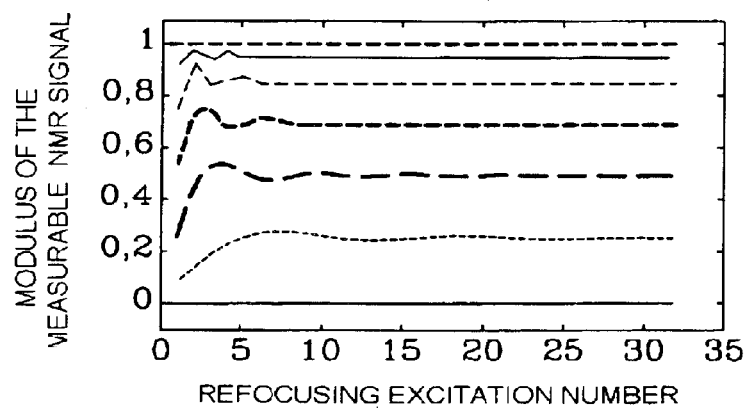
Figure 2B:
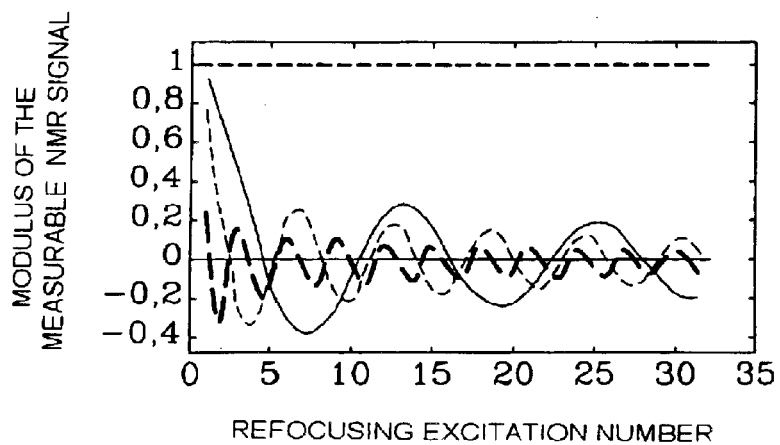
Figure 3:
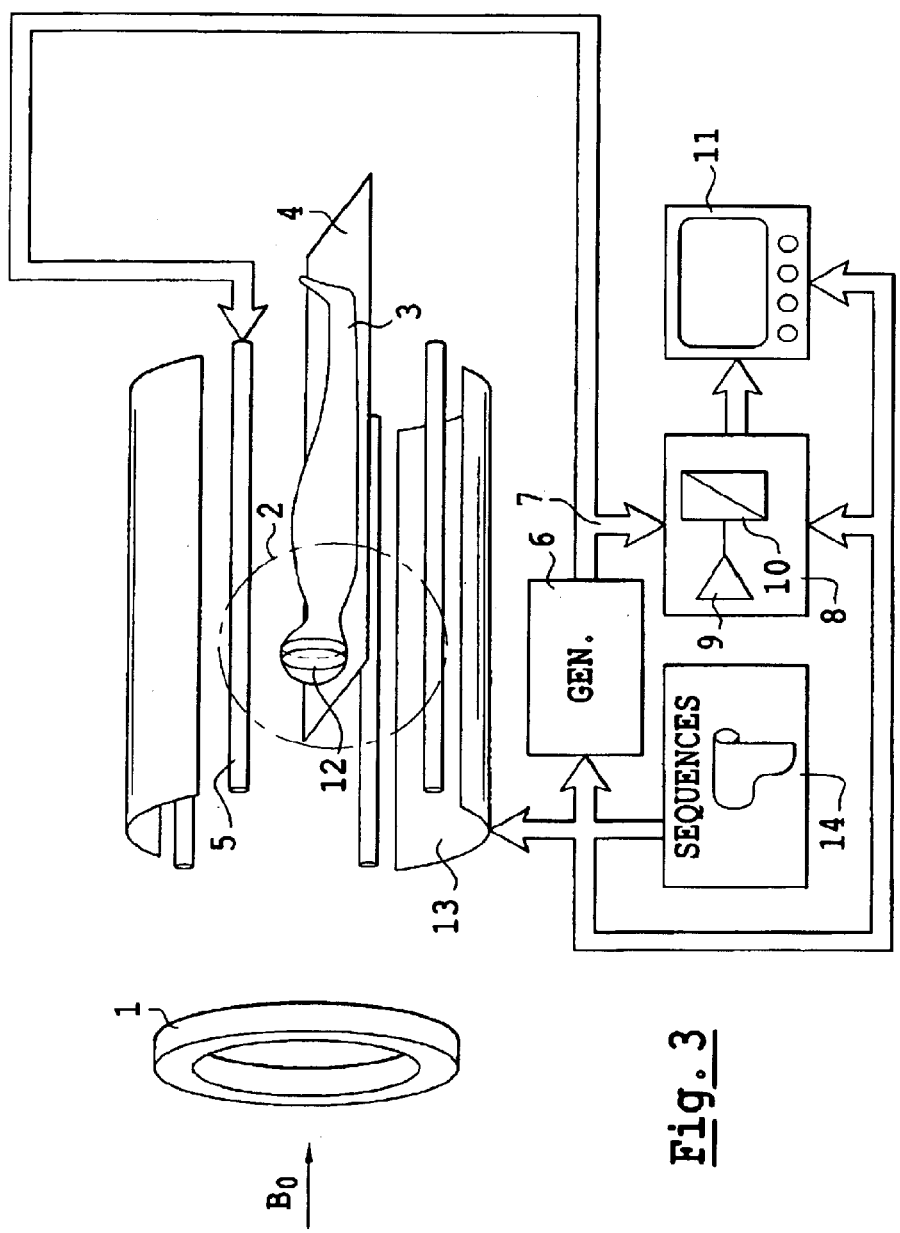
FIG. 3 is a diagrammatic view of an NMR apparatus with which the method of the invention and embodiments thereof can be implemented.

FIG. 3 shows an NMR apparatus for the implementation of the method and embodiments of the invention. Briefly, the apparatus comprises means 1 for producing an intense, continuous and homogeneous magnetic field $B_o$ in a region of examination 2. A body 3, supported for example by a table 4, is brought close to the region 2. Throughout the experiment, the body remains subjected to the magnetic field $B_o$. With an antenna 5 connected to an operator 6, it is possible to bring about the excitation of the magnetic moments of the particles of the body 3 located in the region of examination 2. In one example, the antenna 5 is a bar antenna capable of producing a rotating excitation field, by the phase-shifted excitation of each of the bars.

The excitations are temporary. At the end of these excitations, the antenna 5 may serve to pick up the de-excitation signal to conduct it, through a duplexer 7, to means 8 for reception. The means 8 for reception conventionally comprise amplification and demodulation circuits 9 and processing circuits 10. The processing may include the shaping of the signal in order to represent it on means 11 for display. The image of a slice 12 of the body 3 can then be made to appear on the screen of the means 11. An imaging sequence designed to obtain an image may comprise a plurality of excitation-measurement sequences during each of which gradient coils 13 are used to apply encodings to the free precession signal of the magnetic moments. These encodings, as well as the working of the generator 6, the duplexer 7 and the means 8 for reception and means 11 for display are governed by a sequencer 14 whose actions are organized by a program. All these elements are known per se. In particular, the sequencer 14 possesses the property of programmability of its sequences.

It is thus possible, in the program, to achieve the simple modification of the operations to be performed in order to change the nature of the sequences undertaken.

Figure 4:
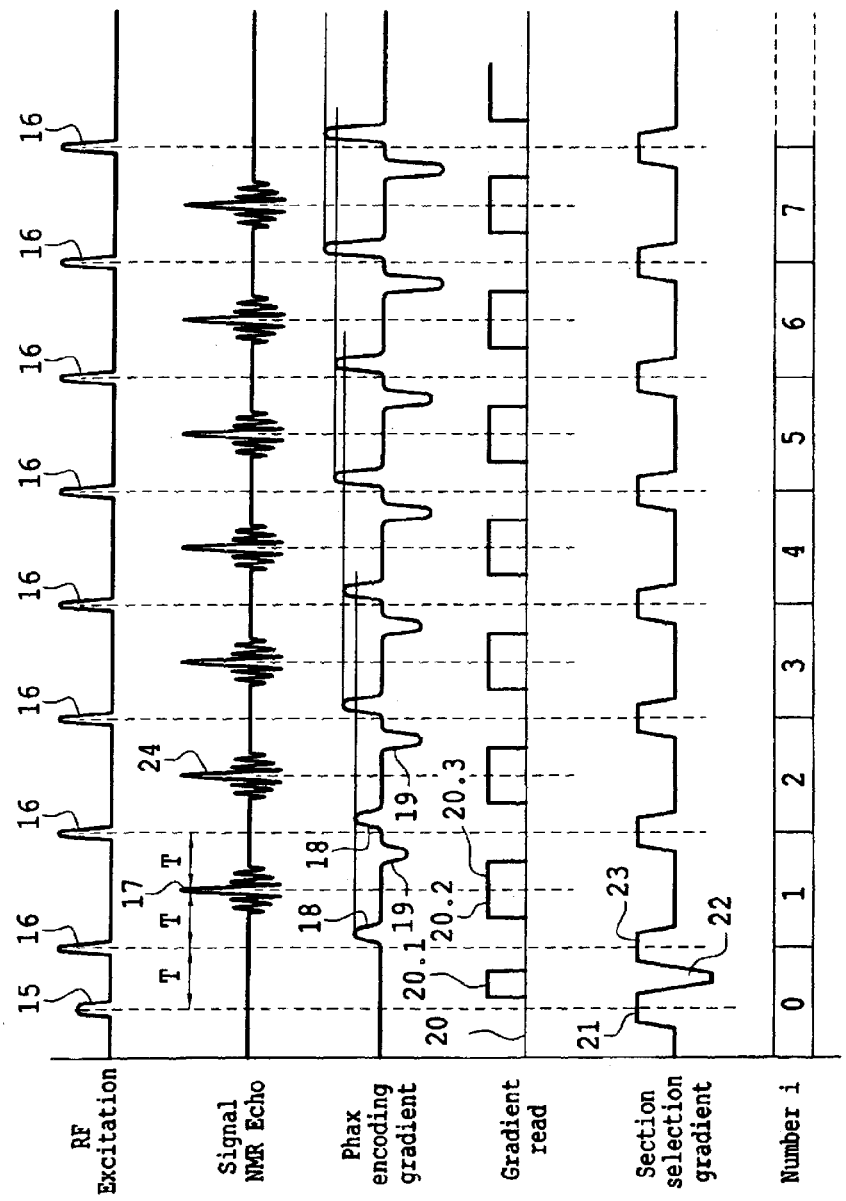
FIG. 4 is a timing diagram showing the different signals applied and received in the apparatus.

FIG. 4 shows a timing diagram of the different signals applied and read in the apparatus. The first line of the diagram shows a first 90° excitation pulse 15, followed by a regular string of 180° refocusing pulses 16. The last line of the diagram shows the numbers i of the spin echoes sequences implied by the pulses 16. These numbers i are odd numbers or even numbers. The second line of the diagram shows the NMR echo signal 17 resulting from the reflection of the phase dispersal prompted by the refocusing pulse 16. The signals 17 that result therefrom are separated by a duration T from the central date of the refocusing pulse 16 that has given rise to them. This duration T is also the duration between the central dates of the pulses 15 and 16.

The third line shows the phase encoding gradient applied to one of the axes (preferably the axis y of the apparatus). This phase encoding gradient herein has three particular features. Firstly, like a phase encoding gradient of a 2DFT type sequence, it grows from one imaging sequence to another. However here, and this is its second particular feature, for an odd-numbered period and for an even-numbered period that immediately follows it (or the reverse) it retains the same value. The third particular feature is that the phase encoding pulse 18 present in an odd-numbered or an even-numbered period is compensated for, respectively during the same period, by an equal but opposite compensation pulse 19 so that, for a pair of subsequent periods, the NMR signal is restored to its initial state.

The read gradient pulses are shown in the fourth line The read gradient pulses are kept always oriented in the same way (namely with a component have the same sign relative to a non-gradient state 20) may be compensated for by the application of pulses 20.1 and 20.2 present before and after the 180° excitation pulse 16. The gradient pulse 20.2 is supplemented during the reading by a hold pulse 20.3 (symmetrical to 20.2 with respect to the central reading date). This hold pulse 20.3 is itself compensated for in the following excitation and so on and so forth. In a section select gradient, only the selection pulse 21 present at the time of the 90° excitation pulse 15 must be compensated for by an inverse integral pulse 22. The section select pulses 23 corresponding to the applications of the refocusing pulses 16 are self-compensated as being present before and after this refocusing pulse.

By this action, the signal 17 measured during the odd-numbered echoes of the signal 24 measured during the even-numbered echoes will be distinguished in the NMR signal. With regard to the odd-numbered echoes, it is possible, according to the teaching of the patent referred to above, to acquire an odd-numbered image for which the phase of the refocusing pulse 16 is offset quadratically depending on the rank i of the concerned refocusing pulse. The same arrangement is valid for the even-numbered image made with the echoes 24.

In an embodiment of the invention, the method is limited to a quadratic development of the phase of the refocusing excitation 16. This means that the phase varies with respect to a reference phase (for example locked into the 90° excitation, phase 15, but not necessarily so) according to a variation of the type $\phi = \Delta_{x\,i2} + b_{x\,i+c}$. In this expression b and c may be any values, possibly zero. This may lead especially to having a quadratic phase shift of the even-numbered refocusing pulses and another quadratic phase shift (but with a same common difference) of the phases of the odd-numbered refocusing pulses. In practice, to simplify matters, while the phase encoding gradient pulses (generally the axis y) remain the same for two successive read operations, the index, which is a natural number, of the refocusing pulse will grow regularly.

The reason for the choice of a quadratic evolution of the phase is that it is the only worthwhile solution for the modification of the refocusing excitations, because it leads to a linear frequency sweep, each small frequency band being taken into consideration identically. This can be demonstrated.

Figure 5:
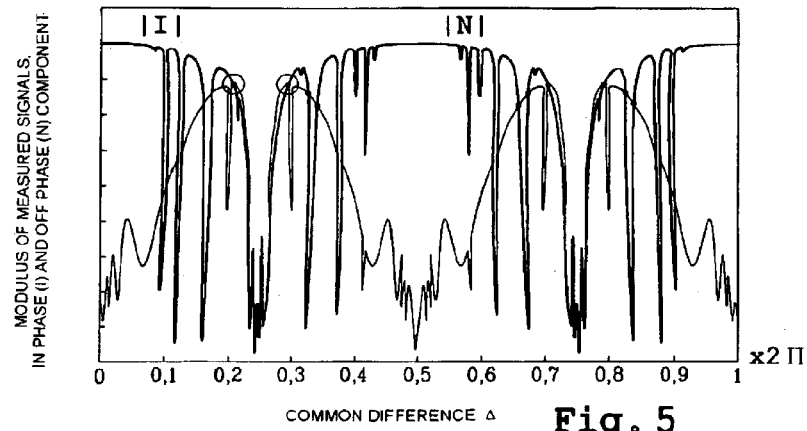
FIG. 5 shows the resulting NMR signals in phase and off phase (quadrature components) measured for a value of the quadratic common difference $\Delta$ expressed as a function of a fraction of $2\pi$.

The question then is to compute $\Delta$ to make the $\phi = \Delta_{x\,i2}$ type phase evolve quadratically in an efficient way. In an embodiment of the invention, as shown in FIG. 5, all the possible values of $\Delta$ have been tested, starting from fractions of $1/4999$ to $4998/4999$ of $2\pi$, and this has been done for flip angles of 180°, 170°, 160°, up to 30°. This computation is possible in practice only after it has been shown that a stationary behavior is possible with quadratic phases. FIG. 5 shows the moduli of stabilized real and imaginary parts of the demodulated NMR signals. The figure designates values of $\Delta$, indicated by dots, in particular those that are encircled, for which a significant and identical signal was obtained, both for demodulation with an initial magnetization in phase (curve I) and for an initial magnetization in phase quadrature (curve N). It is recalled that these two demodulations enable access to the in-phase components (real part) and off-phase components (imaginary part) of the NMR signal. The dots marked in FIG. 5 show the cases where the signals measured in both cases are identical. The encircled dots are those for which, in addition, the maximum of the signal is measured. In practice, the two curves I and N are deduced from each other by a translation by $\pi$. The symmetries shown indicate that, inasmuch as the value of $\Delta$, equal to about $19/49 \times \pi$, comprised an inverse with respect to $\pi/2$ (namely $0.25 \times 2\pi$), these two values accept correspondingly equivalent inverse elements with respect to $\pi$. Thus FIG. 5 makes it possible to confirm the results disclosed in the patent referred to above.

Figure 6:
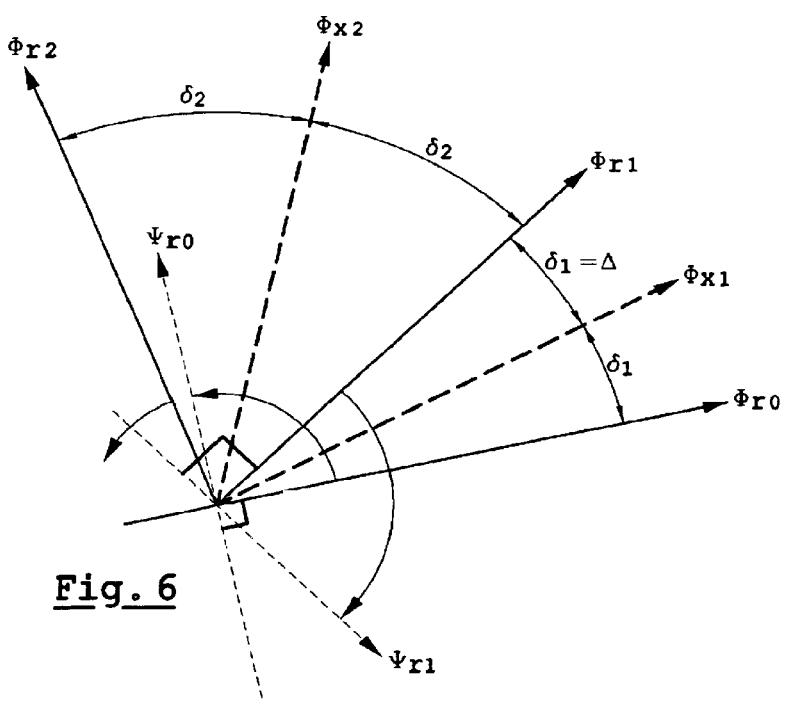
FIG. 6 shows the phase-locking of a receiver with respect to a transmitter.

FIG. 6 shows how to lock the phase of the receiver for each reception period. The principle of this locking lies in ensuring that if the flip angle of the refocusing pulse is 180°, then an initial magnetization aligned with a chosen direction generates a constant signal for all the following echoes. It will be shown that one of the components (real or imaginary), namely always the same one, is sought while the other component (imaginary or real) changes its sign from one echo to another. The modified phase, at the transmission of the refocusing excitations, is that of the carrier (at f0). Similarly, the phase of the carrier at reception is modified. In practice, given a synthetic processing of the sampled and quantified signals received, the reception phase is only computed.

In FIG. 6, the phase of the first echo pulse is $\Phi_{x1}$ while that of the next one is $\Phi_{x2}$. The term $\Phi_{r1}$ denotes the phase of the carrier at the reception of the first echo and $\Phi_{r2}$ denotes the phase of the carrier at the reception of the second echo. The aim is to determine $\Phi_{r1}$ and $\Phi_{r2}$. We shall show how this aim is achieved. A direction of magnetization $\Phi_{r0}$ is chosen (before the excitation $\Phi_{x1}$). For this choice, the direction x (in the rotating reference system) is taken. It could be shown that this is not a necessity. Naturally, with respect to this chosen direction $\Phi_{r0}$, it is possible to determine a direction (hence the phase) of the axis around which the 180° flip is prompted. Let $\delta_1$ be the phase difference between $\Phi_{r0}$ and $\Phi_{xi}$ and $\delta_2$ the difference between $\Phi_{ri}$ and $\Phi_{x2}$. It can easily be understood that the signals whose in-phase component is oriented along $\Phi_{r0}$, and undergoes the phase dispersal will then be rephased with the $\Phi_{r0}$ phase when they are in the direction $\Phi_{r1}$, symmetrical with $\Phi_{r0}$ with respect to $\Phi_{x1}$. These considerations enable the locking of the phase of the receiver. The computation that leads thereto is the following:

$(\Phi_{ri}+\Phi_{ri-1})/2=\Phi_{xi}$, $i$ being the current index (equation 1)

with $\Phi_{xi}=\Phi_{ri-1}+\delta_i$ (equation 2)

and $\Phi_{ri}=\Phi_{xi}+\delta_i$ and $\Phi_{ri-1}=\Phi_{xi-1}+\delta_{i-1}$ (equation 3)

whence we deduce $\Phi_{xi}-\Phi_{xi-1}=\delta_i+\delta_{i-1}$. (equation 4)

The difference $\delta_i$ is such that $\Delta_i=\delta_i-\delta_{i-1}$, for $i$ greater than 2 (equation 5)

with $\Delta_1=\delta_1$. (equation 6)

The value $\Delta_i$ is the common difference of the quadratic equation. If $\Delta_i$ is constant, the progression is a pure quadratic progression.

In FIG. 6, in fact, the initial magnetizations are not all oriented as $\Phi_{r0}$. Besides, it is from there that the problem arises. To take them all into consideration, it is considered that the magnetization values (which are initial to begin with) are broken down in the reference system formed by $\Phi_{r0}$ and $\Psi_{r0}$. The following ones, after the first refocusing, will be broken down in the reference system formed by $\Phi_{r1}$ and $\Psi_{r1}$ and so on arid so forth in the reference systems formed by $\Phi_{r1}$ and $\Psi_{r1}$. The particular feature of these reference systems is that they are alternately direct (in the trigonometric sense for $\Phi_{r0}$ and $\Psi_{r0}$ and $\Phi_{r2}$ and $\Psi_{r2}$), or inverse (in the clockwise sense for $\Phi_{r1}$ and $\Psi_{r1}$). All the components of the magnetizations along $\Phi_{r0}, \Phi_{r1} \ldots \Phi_{ri}$ undergo a demodulation processing in accordance with the processing of the signals meeting the CPMG conditions; the others, along $\Psi_{r0}, \Psi_{r1} \ldots \Psi_{ri}$, undergo a demodulation processing operation in accordance with the processing of the signals meeting the anti-CPMG conditions. This is why a double reading is undertaken with a double encoding on the axis y, and with a rephasing of NMR signals 17 and 24.

When the numbers i of the refocusing pulses are even-numbered values, from one even-numbered refocusing pulse to a following odd-numbered refocusing pulse, the phase of the refocusing pulse evolves quadratically (this is also the case when moving from an odd-numbered value to an even-numbered value). A first set of even echo signals is then read at the end of an even-numbered refocusing pulse. A second set of odd echo signals is also read at the end of an odd-numbered refocusing pulse. An addition image and a subtraction image are computed on the basis of an additive combination and a subtractive combination of the even-numbered and odd-numbered signals. The two addition and subtraction images are processed together to produce output image.

In an embodiment of the invention, to stabilize the dynamic equilibrium from the very outset, an empirical search is made for a given number of preparation from the start, seven echoes are chosen and experience has shown, thereafter, that a greater number of echoes does not give significantly improved results. For these echoes, in considering the stationary operating state with $\Delta=$10⁄49 (or more specifically 957⁄4999), it was sought to find out which progression of $\Delta$ would lead to the fastest stabilization of the dynamic equilibrium. The computation undertaken was done as it was for the computation of $\Delta$, from fractions in n⁄4999 of $2\pi$. The following values of $\Delta$ were found, indexed by the natural number 1 of the echo sequence to which they correspond:

| I | $\Delta_I$ |
|---|---|
| 1 | 0.191438 |
| 2 | 0.192650 |
| 3 | 0.225601 |
| 4 | 0.197626 |
| 5 | 0.129640 |
| 6 | 0.197671 |
| 7 | 0.282091 |
| 8 | 0.191438 = 957/4999 |
| 9 | 0.191438 = 957/4999 |
| 10 | 0.191438 = 957/4999 |
| 11 | 0.191438 = 957/4999 |
| 12 | 0.191438 = 957/4999 |
| ... | " " " " " |

The values of this table can be approximated to 5%, or even 10% in certain cases, for certain sequences. However, for refocusing excitations that give rise to refocusing angles far below 180°, it might be useful to choose the values of the table with lower tolerance. The greater the divergence from 180°, the greater should be the precision maintained.

In this preparatory sequence of seven pulses, four pulses, the pulses numbered 1, 2, 4 and 6 have a value of quadratic common difference $\Delta_i$ that is highly comparable with the definitive common difference $\Delta$ of the known quadratic evolution. The third pulse has a value greater than this definitive common difference $\Delta$, the fifth pulse has a lower value and the seventh pulse has a higher value.

One skilled in the art may make or propose various modifications in structure and/or manner and/or way and equivalents thereof to the disclosed embodiments without departing from the scope and extent of the invention.

What is claimed is:

1. A method of signal acquisition in an NMR experiment comprising:

subjecting a body to be examined to a magnetic orientation field;

subjecting the body thus magnetically oriented to an initial electromagnetic excitation;

subjecting the body to a succession of refocusing excitations;

modifying quadratically the phase $\Phi_{xi}$ of the refocusing excitations numbered i in the succession wherein it is of the $\Phi_{xi}-\Phi_{xi-1}=\delta_i+\delta_{i-1}$ type with a common difference $\Delta$ equal to $\delta_i-\delta_{i-1}$; and applying at the start of the quadratic evolution, a sequence of preparation excitations during which the common difference $\Delta$ evolves according to a chronological sequence planned in advance which stabilizes the dynamic equilibrium from the very outset of the quadratic evolution.

2. The method according to claim 1 wherein, for the first values of i, the common difference $\Delta$ possesses the following variable values $\Delta_i$:

| I | $\Delta_I$ |
|---|---|
| 1 | 0.191438 |
| 2 | 0.192650 |
| 3 | 0.225601 |
| 4 | 0.197626 |
| 5 | 0.129640 |
| 6 | 0.197671 |
| 7 | 0.282091 |
| 8 | 0.191438 = 957/4999 |
| 9 | 0.191438 = 957/4999 |
| 10 | 0.191438 = 957/4999 |
| 11 | 0.191438 = 957/4999 |
| 12 | 0.191438 = 957/4999 |
| ... | " " " " " | with a tolerance of more or less 10% for each common difference value.

3. The method according to claim 1 wherein, in the sequence of preparation excitations, four pulses, the pulses of natural numbers 1, 2, 4 and 6, have a quadratic common difference value $\Delta_i$ comparable to a definitive common difference value $\Delta$ of the known quadratic evolution;

a third pulse has a value greater than the definitive common difference;

a fifth pulse has a lower value than the definitive common difference; and the seventh pulse has a higher value than the definitive common difference.

4. The method according to claim 1 wherein, in the sequence of preparation excitations, four pulses, the pulses of natural numbers 1, 2, 4 and 6, have a quadratic common difference value $\Delta_i$ comparable to a definitive common difference value $\Delta$ of the known quadratic evolution;

a third pulse has a value greater than the definitive common difference;

a fifth pulse has a lower value than the definitive common difference; and the seventh pulse has a higher value than the definitive common difference.

5. The method according to claim 1 wherein the initial and refocusing pulses give rise to 90° and 180° flips respectively.

6. The method according to claim 2 wherein the initial and refocusing pulses give rise to 90° and 180° flips respectively.

7. The method according to claim 3 wherein the initial and refocusing pulses give rise to 90° and 180° flips respectively.

8. The method according to claim 4 wherein the initial and refocusing pulses give rise to 90° and 180° flips respectively.

9. The method according to claim 1 wherein:

the numbers i of the refocusing pulses are of the even-numbered or odd-numbered type;

from an even-numbered or odd-numbered refocusing pulse to a following odd-numbered or even-numbered refocusing pulse, the phase of the refocusing pulse evolves quadratically;

a first set of even-numbered echo signals is read at the end of an even-numbered refocusing pulse;

a second set of odd-numbered echo signals is read at the end of an odd-numbered refocusing pulse;

an addition image and a subtraction image are computed on the basis of an additive combination and a subtractive combination of the even-numbered and odd-numbered signals; and the two addition and subtraction images are processed together to produce an output image.

10. The method according to claim 2 wherein:

the numbers i of the refocusing pulses are of the even-numbered or odd-numbered type;

from an even-numbered or odd-numbered refocusing pulse to a following odd-numbered or even-numbered refocusing pulse, the phase of the refocusing pulse evolves quadratically;

a first set of even-numbered echo signals is read at the end of an even-numbered refocusing pulse;

a second set of odd-numbered echo signals is read at the end of an odd-numbered refocusing pulse;

an addition image and a subtraction image are computed on the basis of an additive combination and a subtractive combination of the even-numbered and odd-numbered signals; and the two addition and subtraction images are processed together to produce an output image.

11. The method according to claim 3 wherein:

the numbers i of the refocusing pulses are of the even-numbered or odd-numbered type;

from an even-numbered or odd-numbered refocusing pulse to a following odd-numbered or even-numbered refocusing pulse, the phase of the refocusing pulse evolves quadratically;

a first set of even-numbered echo signals is read at the end of an even-numbered refocusing pulse;

a second set of odd-numbered echo signals is read at the end of an odd-numbered refocusing pulse;

an addition image and a subtraction image are computed on the basis of an additive combination and a subtractive combination of the even-numbered and odd-numbered signals; and the two addition and subtraction images are processed together to produce an output image.

12. The method according to claim 4 wherein:

the numbers i of the refocusing pulses are of the even-numbered or odd-numbered type;

from an even-numbered or odd-numbered refocusing pulse to a following odd-numbered or even-numbered refocusing pulse, the phase of the refocusing pulse evolves quadratically;

a first set of even-numbered echo signals is read at the end of an even-numbered refocusing pulse;

a second set of odd-numbered echo signals is read at the end of an odd-numbered refocusing pulse;

an addition image and a subtraction image are computed on the basis of an additive combination and a subtractive combination of the even-numbered and odd-numbered signals; and the two addition and subtraction images are processed together to produce an output image.

13. The method according to claim 5 wherein:

the numbers i of the refocusing pulses are of the even-numbered or odd-numbered type;

from an even-numbered or odd-numbered refocusing pulse to a following odd-numbered or even-numbered refocusing pulse, the phase of the refocusing pulse evolves quadratically;

a first set of even-numbered echo signals is read at the end of an even-numbered refocusing pulse;

a second set of odd-numbered echo signals is read at the end of an odd-numbered refocusing pulse;

an addition image and a subtraction image are computed on the basis of an additive combination and a subtractive combination of the even-numbered and odd-numbered signals; and the two addition and subtraction images are processed together to produce an output image.

14. An apparatus configured for signal acquisition in NMR comprising:

means for subjecting a body to a magnetic orientation field;

means for subjecting the body to an initial electromagnetic excitation;

means for subjecting the body to a succession of refocusing excitations;

wherein the phase $\Phi_{xi}$ of the refocusing excitations is modified quadratically numbered i in the succession and wherein it is of the $\Phi_{xi}-\Phi_{xi-1}=\delta_i+\delta_{i-1}$ type with a common difference $\Delta$ equal to $\delta_i-\delta_{i-1}$; and means for subjecting the body to sequence of preparation excitations at the start of the quadratic evolution, the sequence of preparation excitations is applied during which the common difference $\Delta$ evolves according to a chronological sequence planned in advance which stabilizes the dynamic equilibrium from the very outset of the quadratic evolution.

15. The apparatus according to claim 14 wherein, for the first values of i, the common difference $\Delta$ possesses the following variable values $\Delta_I$:

| I | $\Delta_I$ |
|---|---|
| 1 | 0.191438 |
| 2 | 0.192650 |
| 3 | 0.225601 |
| 4 | 0.197626 |
| 5 | 0.129640 |
| 6 | 0.197671 |
| 7 | 0.282091 |
| 8 | 0.191438 = 957/4999 |
| 9 | 0.191438 = 957/4999 |
| 10 | 0.191438 = 957/4999 |
| 11 | 0.191438 = 957/4999 |
| 12 | 0.191438 = 957/4999 |
| ... | " " " " " | with a tolerance of more or less 10% for each common difference value.

16. The apparatus according to claim 14 wherein, in the sequence of preparation excitations, four pulses, the pulses of natural numbers 1, 2, 4 and 6, have a quadratic common difference value $\Delta_i$ comparable to a definitive common difference value $\Delta$ of the known quadratic evolution;

a third pulse has a value greater than the definitive common difference;

a fifth pulse has a lower value than the definitive common difference; and the seventh pulse has a higher value than the definitive common difference.

17. The apparatus according to claim 15 wherein, in the sequence of preparation excitations, four pulses, the pulses of natural numbers 1, 2, 4 and 6, have a quadratic common difference value $\Delta_i$ comparable to a definitive common difference value $\Delta$ of the known quadratic evolution;

a third pulse has a value greater than the definitive common difference;

a fifth pulse has a lower value than the definitive common difference; and the seventh pulse has a higher value than the definitive common difference.

18. The apparatus according to claim 16 wherein, in the sequence of preparation excitations, four pulses, the pulses of natural numbers 1, 2, 4 and 6, have a quadratic common difference value $\Delta_i$ comparable to a definitive common difference value $\Delta$ of the known quadratic evolution;

a third pulse has a value greater than the definitive common difference;

a fifth pulse has a lower value than the definitive common difference; and the seventh pulse has a higher value than the definitive common difference.

19. The apparatus according to claim 14 wherein the initial and refocusing pulses give rise to 90° and 180° flips respectively.

20. The apparatus according to claim 15 wherein the initial and refocusing pulses give rise to 90° and 180° flips respectively.

21. The apparatus according to claim 16 wherein the initial and refocusing pulses give rise to 90° and 180° flips respectively.

22. The apparatus according to claim 14 wherein:

the numbers i of the refocusing pulses are of the even-numbered or odd-numbered type;

from an even-numbered or odd-numbered refocusing pulse to a following odd-numbered or even-numbered refocusing pulse, the phase of the refocusing pulse evolves quadratically;

a first set of even-numbered echo signals is read at the end of an even-numbered refocusing pulse;

a second set of odd-numbered echo signals is read at the end of an odd-numbered refocusing pulse;

an addition image and a subtraction image are computed on the basis of an additive combination and a subtractive combination of the even-numbered and odd-numbered signals; and the two addition and subtraction images are processed together to produce an output image.

23. The apparatus according to claim 15 wherein:

the numbers i of the refocusing pulses are of the even-numbered or odd-numbered type;

from an even-numbered or odd-numbered refocusing pulse to a following odd-numbered or even-numbered refocusing pulse, the phase of the refocusing pulse evolves quadratically;

a first set of even-numbered, echo signals is read at the end of an even-numbered refocusing pulse;

a second set of odd-numbered echo signals is read at the end of an odd-numbered refocusing pulse;

an addition image and a subtraction image are computed on the basis of an additive combination and a subtractive combination of the even-numbered and odd-numbered signals; and the two addition and subtraction images are processed together to produce an output image.

24. The apparatus according to claim 16 wherein:

the numbers i of the refocusing pulses are of the even-numbered or odd-numbered type;

from an even-numbered or odd-numbered refocusing pulse to a following odd-numbered or even-numbered refocusing pulse, the phase of the refocusing pulse evolves quadratically;

a first set of even-numbered echo signals is read at the end of an even-numbered refocusing pulse;

a second set of odd-numbered echo signals is read at the end of an odd-numbered refocusing pulse;

an addition image and a subtraction image are computed on the basis of an additive combination and a subtractive combination of the even-numbered and odd-numbered signals; and the two addition and subtraction images are processed together to produce an output image.

25. The apparatus according to claim 17 wherein:

the numbers i of the refocusing pulses are of the even-numbered or odd-numbered type;

from an even-numbered or odd-numbered refocusing pulse to a following odd-numbered or even-numbered refocusing pulse, the phase of the refocusing pulse evolves quadratically;

a first set of even-numbered echo signals is read at the end of an even-numbered refocusing pulse;

a second set of odd-numbered echo signals is read at the end of an odd-numbered refocusing pulse;

an addition image and a subtraction image are computed on the basis of an additive combination and a subtractive combination of the even-numbered and odd-numbered signals; and the two addition and subtraction images are processed together to produce an output image.

26. The apparatus according to claim 22 wherein the initial and refocusing pulses give rise to 90° and 180° flips respectively.

27. An article of manufacture having a computer readable program code means embodied therein which causes signal acquisition in NMR, the computer readable program code means in the article of manufacture comprising:

computer readable program code means for subjecting a body to a magnetic orientation field;

computer readable program code means for subjecting the body to an initial electromagnetic excitation;

computer readable program code means for subjecting the body to a succession of refocusing excitations;

wherein the phase $\Phi_{xi}$ of the refocusing excitations is modified quadratically numbered i in the succession and wherein it is of the $\Phi_{xi}-\Phi_{xi-1}=\delta_i+\delta_{i-1}$ type with a common difference $\Delta$ equal to $\delta_i-\delta_{i-1}$; and computer readable code means for subjecting the body to sequence of preparation excitations at the start of the quadratic evolution, the sequence of preparation excitations is applied during which the common difference $\Delta$ evolves according to a chronological sequence planned in advance which stabilizes the dynamic equilibrium from the very outset of the quadratic evolution.

28. A computer program product configured for use with an NMR apparatus, the computer program product comprising:

a computer usable medium having computer readable program code means embodied in the medium which causes a signal acquisition in the apparatus, the computer program product having:

computer readable program code means for subjecting a body to a magnetic orientation field;

computer readable program code means for subjecting the body to an initial electromagnetic excitation;

computer readable program code means for subjecting the body to a succession of refocusing excitations;

wherein the phase $\Phi_{xi}$ of the refocusing excitations is modified quadratically numbered i in the succession and wherein it is of the $\Phi_{xi}-\Phi_{xi-1}=\delta_i+\delta_{i-1}$ type with a common difference $\Delta$ equal to $\delta_i-\delta_{i-1}$; and computer readable code means for subjecting the body to sequence of preparation excitations at the start of the quadratic evolution, the sequence of preparation excitations is applied during which the common difference $\Delta$ evolves according to a chronological sequence planned in advance which stabilizes the dynamic equilibrium from the very outset of the quadratic evolution.

29. A program storage device readable by a machine, tangibly embodying a program of instructions in order to perform method steps which acquire an NMR signal, the method steps comprising:

subjecting a body to be examined to a magnetic orientation field;

subjecting the body thus magnetically oriented to an initial electromagnetic excitation;

subjecting the body to a succession of refocusing excitations;

modifying quadratically the phase $\Phi_{xi}$ of the refocusing excitations numbered i in the succession wherein it is of the $\Phi_{xi}-\Phi_{xi-1}=\delta_i+\delta_{i-1}$ type with a common difference $\Delta$ equal to $\delta_i-\delta_{i-1}$; and applying at the start of the quadratic evolution, a sequence of preparation excitations during which the common difference $\Delta$ evolves according to a chronological sequence planned in advance which stabilizes the dynamic equilibrium from the very outset of the quadratic evolution.

* * * * *